(12) United States Patent
Watson (10) Patent No.: US 6,756,706 B2
(45) Date of Patent: Jun. 29, 2004

(54) METHOD AND APPARATUS FOR COOLING POWER SUPPLY WIRES USED TO DRIVE STAGES IN ELECTRON BEAM LITHOGRAPHY MACHINES

(75) Inventor: Douglas C. Watson, Campbell, CA (US)

(73) Assignee: Nikon Corporation, Tokyo (JP)

(*) Notice: Subject to any disclaimer, the term of this patent is extended or adjusted under 35 U.S.C. 154(b) by 17 days.

(21) Appl. No.: 10/053,795

(22) Filed: Jan. 18, 2002

(65) Prior Publication Data

US 2003/0136923 A1 Jul. 24, 2003

(51) Int. Cl.[7] ............................................. H02K 41/00
(52) U.S. Cl. ............................. 310/12; 310/15; 310/54
(58) Field of Search ................................... 310/12, 15

(56) References Cited

U.S. PATENT DOCUMENTS

| | | | | |
|---|---|---|---|---|
| 5,300,847 A | * | 4/1994 | Haditsch | 310/61 |
| 5,552,888 A | | 9/1996 | Sogard et al. | 356/358 |
| 5,581,135 A | | 12/1996 | Ito et al. | 310/52 |
| 5,703,418 A | | 12/1997 | Assa | 310/12 |
| 5,703,420 A | | 12/1997 | Kamata et al. | 310/54 |
| 5,751,077 A | | 5/1998 | Gonzalez | 310/12 |
| 5,783,877 A | | 7/1998 | Chitayat | 310/12 |
| 5,784,925 A | | 7/1998 | Trost et al. | 74/490.09 |
| 5,834,862 A | | 11/1998 | Hartzell, Jr. | 310/12 |
| 6,084,319 A | | 7/2000 | Kamata et al. | 310/12 |
| 6,140,734 A | | 10/2000 | Hazelton et al. | 310/198 |
| 6,417,914 B1 | * | 7/2002 | Li | 355/75 |

* cited by examiner

*Primary Examiner*—Nicholas Ponomarenko
*Assistant Examiner*—Iraj A. Mohandesi
(74) *Attorney, Agent, or Firm*—Beyer Weaver & Thomas, LLP (57) ABSTRACT

The invention comprises methods and apparatus for cooling electrical leads in an electron beam lithography system. In one embodiment the invention comprises an electron beam projection system including at least one process chamber, containing therein, at least one movable stage and at least one electric stage motor for moving the stage, wherein the electrical stage motor includes magnetic coils encased in a coolant jacket which encloses the coils and encloses a coolant material. The coolant jacket includes coolant input lines for supplying coolant to the coolant jacket and includes coolant return lines for allowing the coolant to flow out of the coolant jacket. The process chamber includes electrical leads for supplying electrical current to systems contained within the process chamber and the electrical leads are cooled by passing them through the coolant lines.

37 Claims, 7 Drawing Sheets

METHOD AND APPARATUS FOR COOLING POWER SUPPLY WIRES USED TO DRIVE STAGES IN ELECTRON BEAM LITHOGRAPHY MACHINES

TECHNICAL FIELD

The invention described herein relates to electron beam lithography systems. In particular, the invention relates to methods and apparatus used to cool the temperature of electrical leads in the process chambers of electron beam lithography systems. Most particularly, the invention relates to methods and apparatus used to cool the temperature of electrical power leads supplying the coils of stage linear motors used to move the stages of electron beam lithography systems.

BACKGROUND

As the limits of conventional focusing optics have been pushed out of the realm of usefulness for photolithography, techniques such as e-beam (electron-beam) lithography have come into wider usage. The need to form ever finer features in the layers of semiconductor wafers has driven the continued development of e-beam devices in order to gain higher resolution necessary to form even finer patterns in the layers of semiconductor devices. Among the differences between e-beam lithography and conventional lithography are that focusing an electron beam requires a different type of "optics", generally involving electromagnetic and/or electrostatic fields to effect focusing and deflection of the beam. Additionally, the nature of e-beam lithography is such that it can only be carried out in a vacuum.

As used herein, the term "lithography" refers to the process whereby a pattern of lines and the like is formed within a layer of a material (e.g., photoresist) on a semiconductor device. The pattern, which represents "converted" material surrounded by "unconverted" material (or vice-versa) is used, in subsequent processing steps, to form corresponding structures in an underlying layer (e.g., polysilicon) on the semiconductor device. Additionally, e-beam lithography can incorporate so-called "direct-write lithography", which refers to creating patterns directly in the layer, without the intermediary of an imaging mask such as is used in conventional photolithography.

Electron beam projection systems use stages to move various system components (e.g., the reticle or the wafer), as is well known in the art. The stages are an effective means used to move system components in order to achieve extremely accurate photolithographic patterning of semiconductor surfaces.

The motive force applied to the stages is commonly provided by stage linear motors. A typical example of such a motor is disclosed in U.S. Pat. No. 6,140,734 to Hazelton et al. entitled "Armature with Regular Windings and Having a High Conductor Density". Such electric motors are able to move wafer stages in a very controlled and accurate manner consistent with the precision placement and location of semiconductor wafers and reticles.

Stage linear motors of the type typically required can, and typically do, comprise multiphase electric motors which can require multiple electric wires to provide power to the coils of such motors. Depending on motor design, wire size, and the duty cycle of the motor, the wires will rise in temperature during use. The resulting temperature increase results in resistance in the wires. This problem is exacerbated in vacuum environments, such as the processing chambers of electron beam lithography systems. In order to avoid excessive increases in resistance, it is necessary that the wires be cooled.

The use of stages and stage motors is common in many types of semiconductor processing machines. Ordinarily, the stages of these types of machines are operated in air or other gaseous environments, such that the wires can effectively be cooled by convection. In such cases, the wire temperature rises until the so-called $I^2R$ losses are balanced by the convective heat transfer rate in the ambient environment. However, in vacuum environments (such as that of a process chamber in an electron beam lithography machine), convective cooling is not possible as a method of wire cooling. In such environments, the heat transfer mechanisms available for cooling are conduction through the insulation of the wires and subsequent radiation to the vacuum chamber walls. Or, alternatively, heat may be conducted along the wires to the ends of the wires where it can be dissipated. Neither of these cooling approaches are very efficient and will cause much higher wire temperatures than is the case where convective heat transfer is available as a cooling means. Making matters worse is the fact that increasing temperature in the wires results in increasing wire resistance, which again further increases power dissipation and heat generation. In such circumstances, a circle of rising temperature and increasing resistance is created.

In addition to the temperature and resistance problems, excess heating causes the wires to reach temperatures high enough such that components in the wire insulation outgas and enter the extremely sensitive vacuum environment. Such a situation is highly undesirable as the outgassed components can have drastic effects on the vacuum processing conditions within the chamber.

Although electron beam lithography systems have numerous process advantages, in particular, their ability to form high resolution patterns in semiconductor wafers, they also present some new difficulties. In particular, there are difficulties in cooling electrical power lines in the high vacuum process environment, e.g., vacuum levels on the order of $10^{-6}$ Torr.

What are needed are methods and apparatus for solving the foregoing heating issues in the power wires of the electron beam lithography systems. The principles of the present invention provide solutions to this and other problems.

Figure 1:
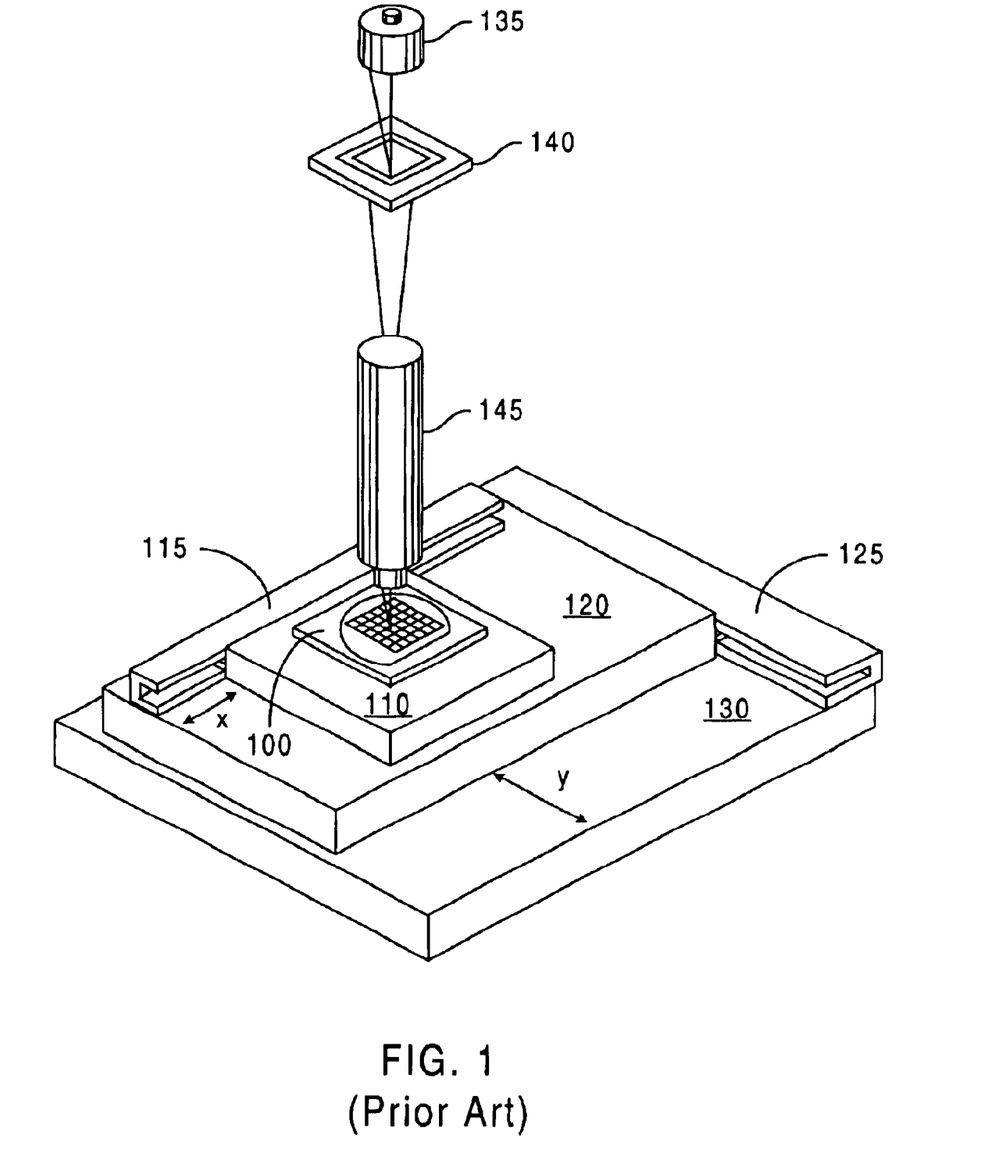
FIG. 1 is a simplified schematic perspective view of an electron beam projections system.

FIG. 1 shows a simplified, schematic, perspective view of an arrangement for positioning a semiconductor wafer 100 in an e-beam lithography system. The wafer 100 is mounted on a bed 110 of an X-Y stage. Typically the wafer is secured to the bed using an electrostatic chuck. The bed 110 is movable in an X-direction by operation of a stage linear motor 115. The wafer 100 is also movable in a Y-direction by a second stage linear motor 125, which moves a bed 120 in the Y-direction. The beds 110, 120 are mounted on a rigid platform 130, which can be secured to a base and with vibration dampers (not shown). In the arrangement shown, the X-Y stage is used to position wafer 100 relative to an optical image produced by an electron beam source 135, a reticle 140, and a projection lens assembly 145 in a step-and-repeat wafer exposure apparatus. The position of the wafer 100 can be measured and calibrated using any of a number of positioning devices (e.g., a laser interferometer system). As will be appreciated by those having ordinary skill in the art, the embodiments of the invention can be used with other types of e-beam systems.

Figure 2:
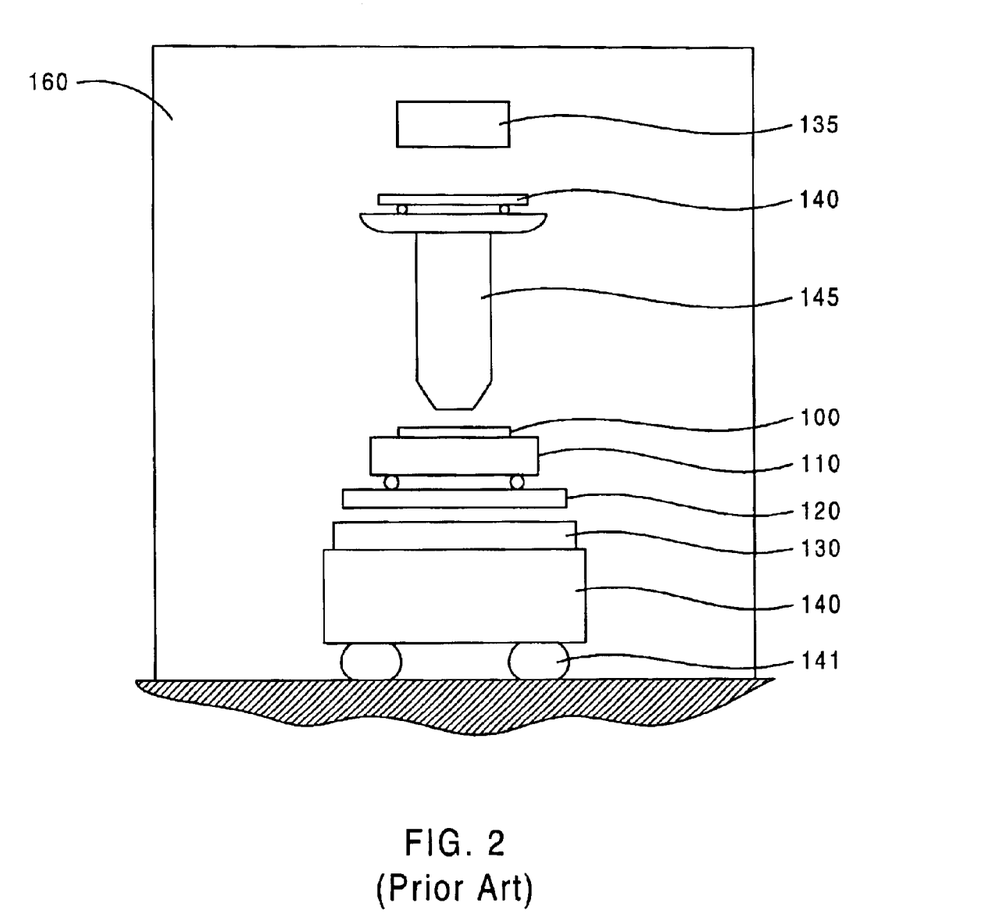
FIG. 2 is a simplified block illustration of an electron beam projection system.

FIG. 2 is another simplified schematic view showing a generally used projection exposure apparatus comprising components such as a wafer stage (110, 120, 130) used for positioning a wafer 100, an optical system 135, which generates illumination which is passed through a reticle on a reticle stage 140 through a projection optical system 145 in order to form an image on the wafer 110. The wafer stage is disposed on a base 140. Vibration removal devices 141 are provided between the base 140 and a floor surface. The entire assembly is positioned inside a processing chamber 160.

Figure 3:
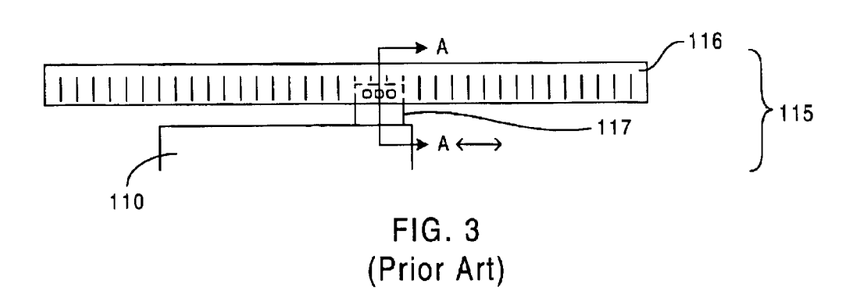
FIG. 3 illustrates a stage linear motor.
Figure 4:
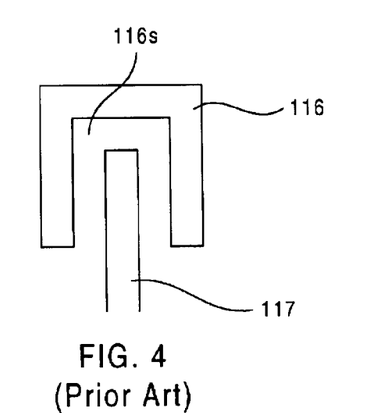
FIG. 4 is a section view of the stage linear motor of FIG. 3.

FIG. 3 is a simplified view of the stage 110 and the stage linear motor 115. The linear motor 115 comprises a coil element 117 attached to the stage 110, and a stator element 116. FIG. 4 shows a cross-section view of the motor along axis A-A. The stator 116 generally comprises a magnetic track having a slot 116S formed therein. The coil assembly 117 is positioned such that it lies in the slot 116S of the stator 116. By selectively energizing the coils of the coil assembly 117, a force is impelled towards the stage 110, which enables the stage to move.

Figure 5:
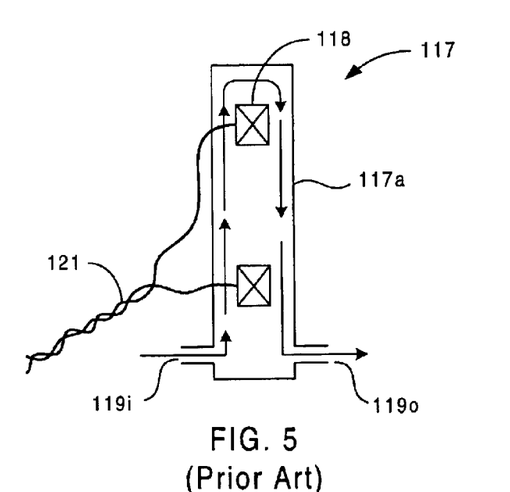
FIG. 5 is a cross-sectional view of a coil assembly forming part of a stage linear motor.

FIG. 5 is an internal section view along axis A-A of the coil assembly 117. Due to the heat generated by coils during ordinary course of operation, the coil assembly 117 is encased in a jacket 117a, which covers the coils 118 and contains a cooling medium. Typically, the cooling medium is flowed into the jacket 117a through an input line 119i through the interior of the jacket 117a such that the coils 118 are cooled. Once circulated through a cooling path (for example, that shown by the arrows), the cooling media is output (or effluxed) from the jacket 117a through an output coolant line 119o. The coils 118 are powered by electricity passed through the conducting leads 121. FIG. 5 shows a pair of electrical leads arranged in an insulated twisted pair configuration. Such arrangements suffer from the aforementioned electrical power line heating problem.

SUMMARY OF THE INVENTION

In accordance with the principles of the present invention, an apparatus and method for cooling electrical leads in an electron beam projection system is disclosed.

One embodiment of the invention comprises an electron beam projection system including at least one process chamber, containing therein at least one movable stage and at least one electric stage motor for moving the stage, wherein the electrical stage motor includes magnetic coils encased in a coolant jacket which encloses the coils and encloses a coolant material. The coolant jacket includes coolant input lines for supplying coolant to the coolant jacket and includes coolant return lines for allowing the coolant to flow out of the coolant jacket. The process chamber includes electrical leads for supplying electrical current to systems contained within the process chamber and the electrical leads are cooled by passing them through the coolant lines.

In another embodiment, an electron beam projection system includes a process chamber containing therein at least one movable stage and at least one electric stage motor for moving the stage. The stage motor includes magnetic coils encased in a coolant jacket which encloses the coils and a coolant. The coolant jacket includes coolant lines for supplying the coolant which are connected to the coolant jacket. The stage motor includes electrical leads for supplying electrical current to the coils and these electrical leads are routed through the coolant lines in order to cool the electrical leads.

A method embodiment for cooling electrical leads in a process chamber of an electron beam projection system comprising the steps of providing, in the process chamber, at least one movable stage having at least one electric stage motor for moving the stage wherein the stage motor includes magnetic coils encased in a coolant jacket which encloses the coils and coolant, providing coolant lines for supplying coolant to the coolant jacket, providing electrical leads for supplying electrical current to systems contained within the process chamber, and cooling the electrical leads by passing the electrical leads through the coolant lines for supplying coolant.

These and other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

Also, it is understood that the depictions in the Figures are not necessarily to scale.

DETAILED DESCRIPTION OF THE DRAWINGS

The embodiments of the present invention provide cooling techniques for the wiring of an electron beam lithography system. In particular, the methods of cooling disclosed herein may be applied to the electrical power lines which supply stage linear motors, wafer chucks, actuators, or other systems used in electron beam lithography systems.

Figure 6:
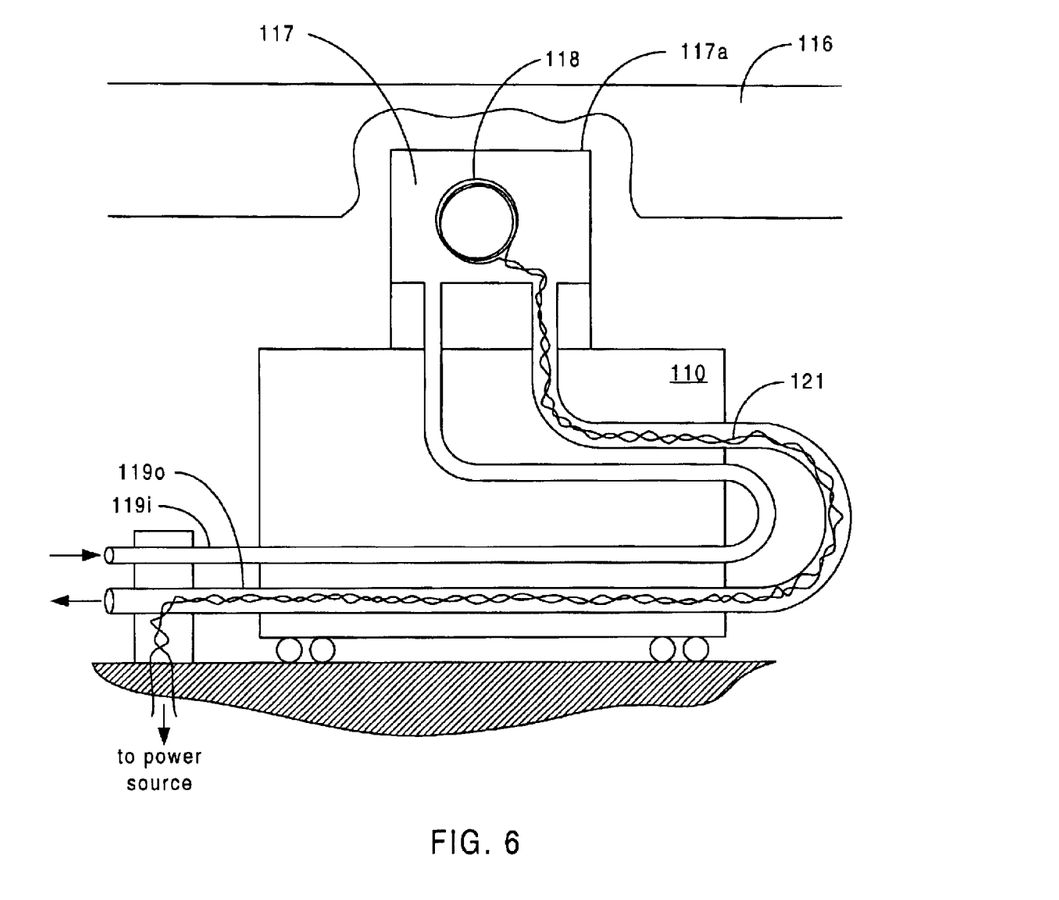
FIG. 6 is a simplified figurative diagram of a portion of an electron beam projection system having leads cooled by the motor coolant system in accordance with the principles of the present invention.

In order to achieve cooling of power leads in a vacuum environment, the embodiments of the present invention route the electrical power leads used to power the coils of a stage motor through coil coolant lines. FIG. 6 is a simplified schematic illustration of one such embodiment. For simplicity's sake, FIG. 6 is shown using a single phase coil embodiment. Such embodiments are not commonly used in linear motor embodiments. However, they may be used to illustrate some of the principles used in the embodiments of the invention. An electrical coil 118 is shown as part of the electrical coil assembly 117. The stator 116 is shown with a cut-out section so that the coil assembly may be more clearly viewed. The electrical power leads 121 are shown here as lightly insulated, twisted pair wires, which are passed through the coolant output line 119$o$, which evacuates coolant from the jacket 117$a$. The coolant output lines 119$o$ are also referred to as coolant efflux line or coolant return lines. The jacket 117$a$ of the coil assembly 117 contains coolant. The coolant may be non-conductive liquid coolant such as FLUORINERT® manufactured by 3M of St. Paul, Minn. Other suitable coolants include electrically non-conductive gases, including but not limited to He, $N_2$, etc. Also, the wires, in a preferred embodiment, are copper wire having a thin coating of insulation. Such insulation should not degrade when exposed to the coolant. As a further advantage, such insulation need not be vacuum compatible.

Although the above diagram illustrates the concept with respect to a single coil, single phase motor, it is intended that the invention be applied to multiple coil, multiple phase motors as well. In preferred embodiments, the coil electrical leads 121 are preferably passed through the coolant outflow lines 119$o$. Alternatively, or additionally, the lines may be passed through the coolant inflow lines 119$i$, but such embodiments are less preferred due to the fact that the coolant is unpredictably heated by the wires as it passes into the jacket 117$a$, thereby reducing overall coil cooling effectiveness. However, in some cases this may be a desirable application. It should be noted that, although the embodiment has been disclosed with respect to the wafer stage, the principles can be applied to reticle stages 140 (see, FIG. 2). Also, the electrical leads, which supply power to the electrostatic chucks used to secure the wafers to the wafer stage, may also be cooled by passing through the coil coolant system. In multiphase motor embodiments, all the electrical power leads which power the coils can be passed through one or more coolant outflow lines 119$o$.

In another embodiment, increased cooling efficiency can be achieved by removing the insulation from the coil power wires. In other embodiments wires of smaller gauges can be used. Such embodiments feature enhanced cooling of the electrical leads by removing the insulation from the leads altogether. In such circumstances (where both electrical lines are uninsulated), twisted pair configurations can no longer be used (due to the problem of short-circuiting). In such cases, the cooling lines, e.g., lines 119$i$, 119$o$, can be formed of electrically non-conductive material to prevent electrical shorting of the wires. Also, the cooling lines can include a layer of electrically non-conductive material on their inside surfaces to prevent electrical shorting.

When using many power supply lines, such as is required for multiphase electrical motors, and especially when using uninsulated power lines, it can be advantageous to run the power lines through more than one coolant return line 119$o$. In fact, the inventor contemplates that one coolant return line may be used for each power line. In this way, each coolant return line contains a single wire conductor.

Figure 7:
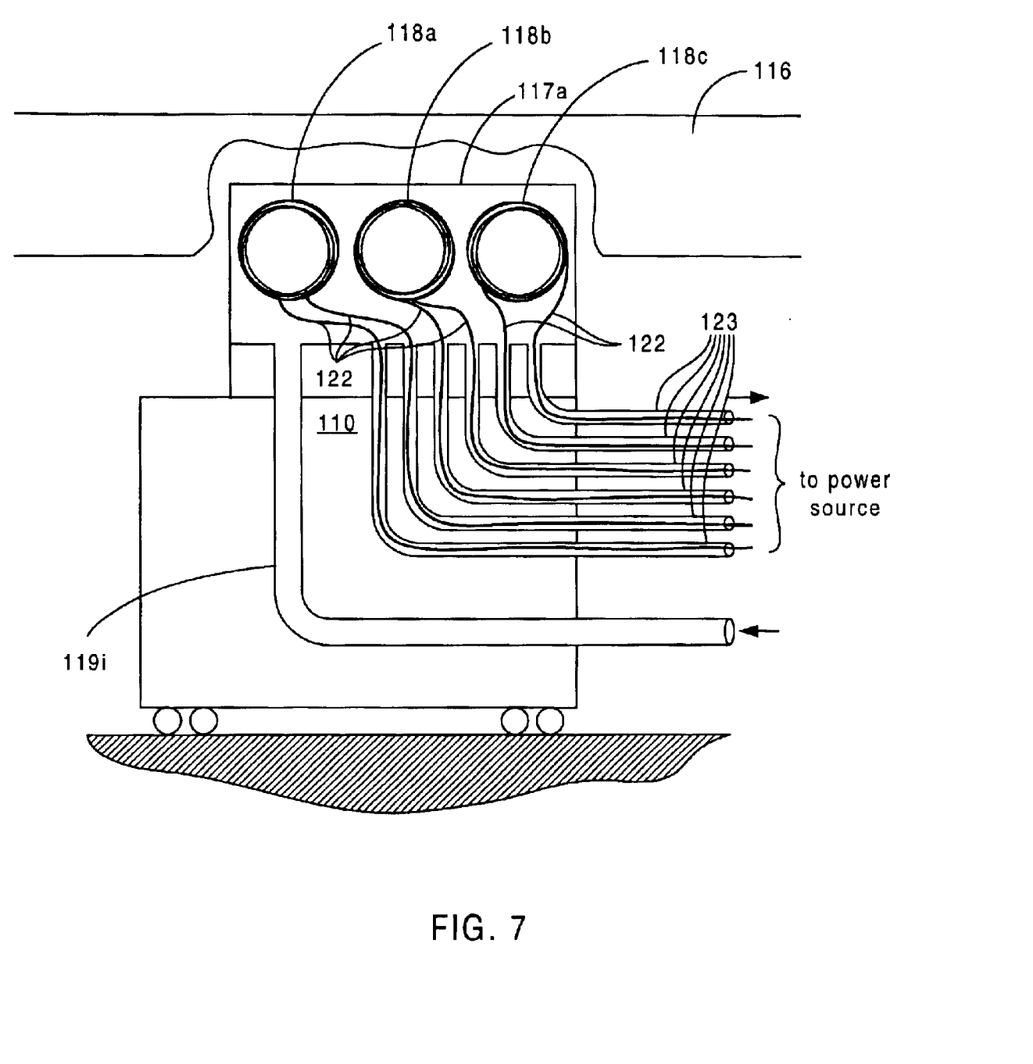
FIG. 7 is a simplified figurative diagram of a portion of an electron beam projection system having a plurality of coolant return lines wherein a plurality of electrical leads are cooled by the motor coolant system in accordance with the principles of the present invention.

FIG. 7 is a simplified schematic illustration of an embodiment of a stage 110 and multi-phase linear motor. The motor includes a stator element 116 and a jacket 117$a$ containing a plurality of electrical coils 118$a$, 118$b$, and 118$c$. As with the other previously described embodiments, the jacket 117$a$ can contain an electrically non-conductive coolant material that cools the coils during operation. The illustration shows three coils 118$a$, 118$b$, and 118$c$; other embodiments can include fewer coils or more coils depending on the system. In the depicted embodiment, each coil features two uninsulated electrical power leads 122, for a total of six power lines, each of which pass through a separate coolant return line 123 to a power source. As with the earlier described embodiments, power lines (not shown) that supply other electrical systems can be run through the coolant return lines 123 for cooling. For example, power lines for supplying electrical power to the electrostatic chuck which secures wafers to the wafer stage during processing can be cooled in this way. As previously described, the coolant return lines 123 can be formed of electrically insulating material to prevent uninsulated wires 122 from shorting against the coolant return lines 123. Alternatively, the coolant return lines 123 can include a layer of electrically insulating material on their inside surfaces to prevent uninsulated wires 122 from shorting against the coolant return lines 123.

Figure 8:
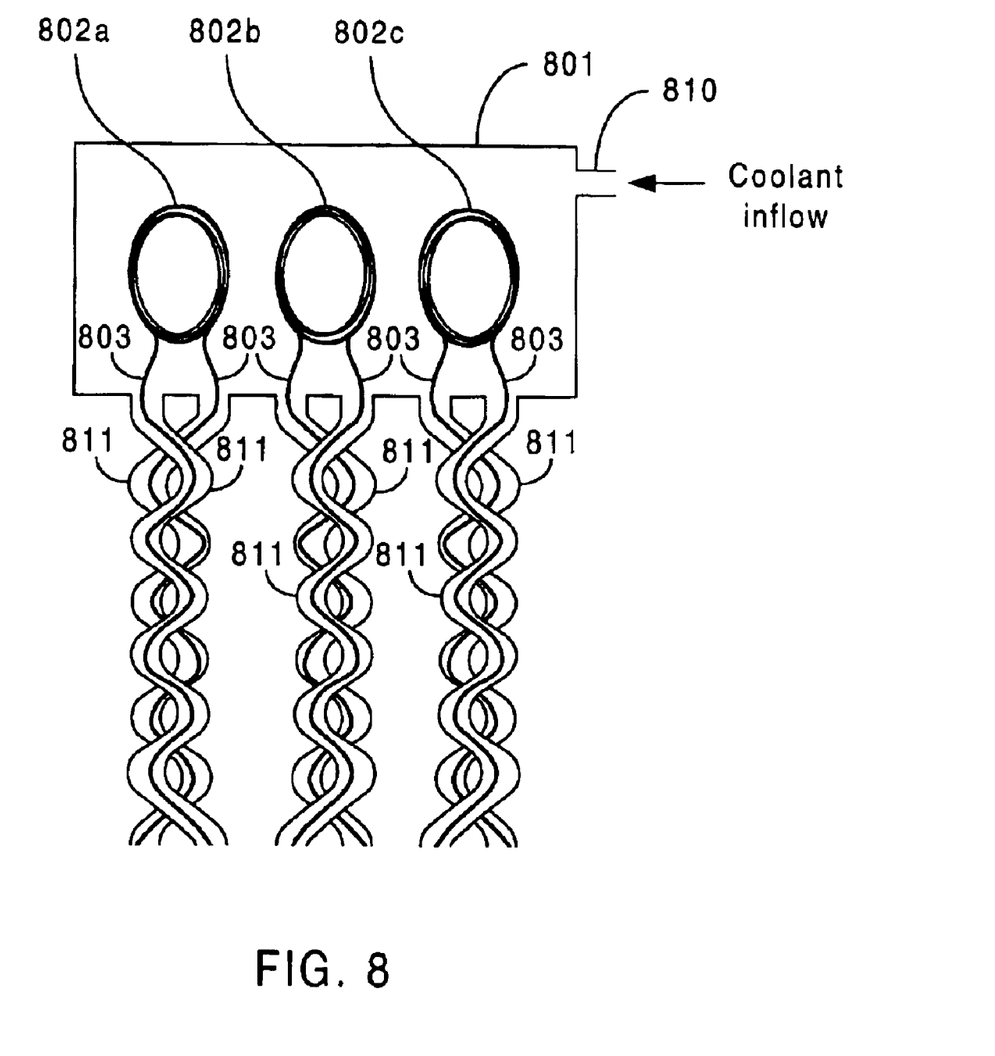
FIG. 8 is a simplified figurative illustration of a portion of a stage motor in an electron beam projection system having a plurality of twisted coolant return lines wherein a plurality of electrical leads are cooled by the motor coolant system in accordance with the principles of the present invention.

FIG. 8 is a simplified schematic illustration of a portion of a multi-phase linear motor. The depicted embodiment shows a jacket 801 including a coolant input line 810 and a plurality of coolant output lines 811. In side the jacket 801 are a plurality of electrical coils 802$a$, 802$b$, and 802$c$. Other motor embodiments can include fewer coils or more coils depending on the system. As with the other previously described embodiments, the jacket 801 can contain an electrically non-conductive coolant material that cools the coils during operation. In the depicted embodiment, each coil features two electrical power leads 803, (shown here as a total of six power lines 803) each of which pass through a separate coolant outflow (return) line 811 to a power source. As described previously, the power lines (not shown) that supply other electrical systems can also be run through the coolant return lines 811 for cooling. Also as previously described, in the case of uninsulated wires 803, the coolant return lines 811 can be formed of electrically insulating material to prevent uninsulated wires 803 from shorting against the coolant return lines 811. Alternatively, the coolant return lines 811 can include a layer of electrically insulating material on their inside surfaces to prevent uninsulated wires 803 from shorting against the coolant return lines 811. The depicted embodiment shows pairs of output coolant lines 811 configured in a twisted arrangement. For example, the lines 811 can be helically wound around each other. In such an arrangement, pairs of electrical leads 803 are threaded through each pair of twisted output coolant lines 811. In this way, the pairs of electrical leads 803 are wound around each other to reduce, for example, electromagnetic interference.

Figure 9:
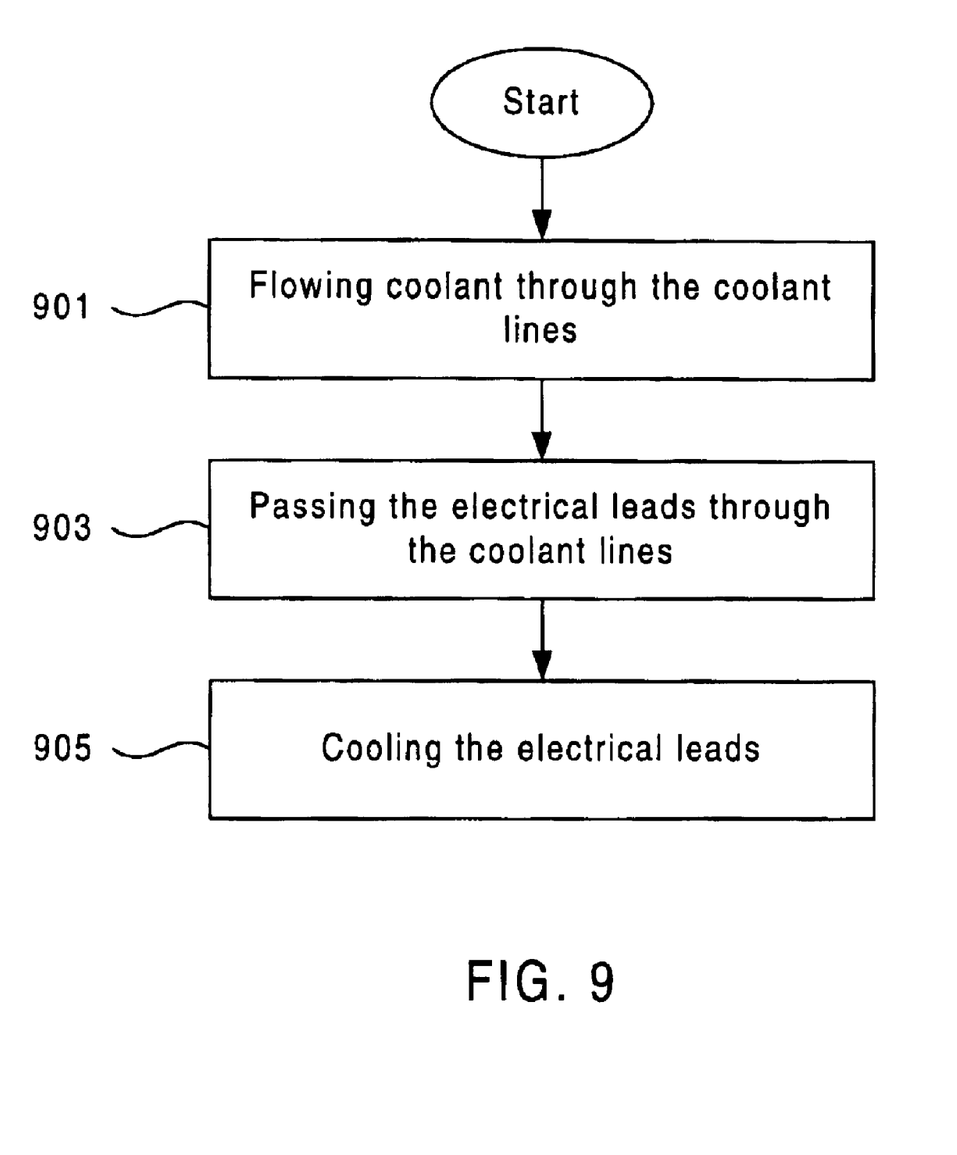
FIG. 9 is a flow diagram illustrating one method embodiment in accordance with the principles of the present invention.

FIG. 9 is a flow diagram illustrating a method embodiment for cooling electrical leads in a process chamber of an electron beam projection system. In one embodiment, the process chamber includes at least one movable stage having at least one electric stage motor for moving the stage. The stage motor includes magnetic coils encased in a coolant jacket which encloses the coils and coolant and wherein coolant lines supply coolant to the coolant jacket and wherein the process chamber includes electrical leads for supplying electrical current to systems contained within the process chamber. The method embodiment comprises flowing coolant through the coolant lines (901), passing the electrical leads through the coolant lines (903), and cooling the electrical leads by passing the flowing coolant through the coolant lines thereby cooling the electrical leads with the coolant (905).

Among the numerous benefits conferred by some of the embodiments of the invention are that the wiring in electron beam systems has minimized resistance increases due to heating. Also, due to lowered temperatures, any wire insulation has a reduced incidence of outgassing. Additionally, due to the enhanced cooling possible in the embodiments of the invention, wiring can operate at higher currents and at greater duty cycles. These advantages are especially useful for wiring in vacuum environments. However, the invention is also advantageous when used in non-vacuum environments where the lower wire temperature results in reduced gas turbulence due to heat-induced conduction effects. An immediate consequence of such conduction induced turbulence is that the accuracy of interferometers used to regulate stage motion can be seriously degraded. By reducing the temperatures in the wires, less error in stage positioning is induced.

The present invention has been particularly shown and described with respect to certain preferred embodiments and specific features thereof. However, it should be readily apparent to those of ordinary skill in the art that various changes and modifications in form and detail may be made without departing from the spirit and scope of the invention as set forth in the appended claims. In particular, it is contemplated by the inventors that the principles of the present invention can be practiced with other semiconductor processing systems, especially those which require power lines to be run through vacuum processing environments. Moreover, the embodiments of the present invention can provide advantages in gaseous processing environments. For example, the embodiments may be used to cool wires in gas containing process chambers in order to reduce heat induced gas turbulence. Also, the embodiments of the present invention are meant to encompass many types of multiphase linear motors including but not limited to, two, three, four, five, and six phase linear motors. Furthermore, the examples provided herein are intended to be illustrative rather than limiting. The inventions illustratively disclosed herein can be practiced without any element which is not specifically disclosed herein.

I claim:

1. An electron beam projection system comprising:
    at least one process chamber, containing therein, at least one movable stage and at least one electric stage motor for moving the stage,
    wherein the electrical stage motor includes magnetic coils encased in a coolant jacket which encloses the coils and encloses a coolant material,
    wherein the coolant jacket includes coolant input lines for supplying coolant to the coolant jacket,
    wherein the coolant jacket includes coolant return lines for allowing the coolant to flow out of the coolant jacket;
    the process chamber including electrical leads for supplying electrical current to systems contained within the process chamber; and
    wherein the electrical leads pass through the coolant return lines.

2. An electron beam projection system as in claim 1 wherein the at least one process chamber contains therein a vacuum environment.

3. An electron beam projection system as in claim 2 wherein the electrical leads include electrically insulated electrical leads.

4. An electron beam projection system as in claim 2 wherein the electrical leads are not electrically insulated; and
    wherein the coolant contained in the coolant jacket consists of an electrically non-conductive coolant material.

5. An electron beam projection system as in claim 4 wherein the electrical leads for supplying electrical current to systems include electrical leads for supplying electrical power to the electrical stage motor.

6. An electron beam projection system as in claim 5 wherein the at least one movable stage includes a wafer stage for moving a semiconductor wafer during processing, and wherein the wafer stage includes an electrostatic chuck for securing the semiconductor wafer to the wafer stage, and wherein the electrical leads for supplying electrical current to systems further include electrical leads for supplying electrical power to the electrostatic chuck and wherein the electrical leads for supplying electrical power to the electrostatic chuck pass through the coolant return lines.

7. An electron beam projection system having a process chamber containing therein at least one movable stage and at least one electric stage motor for moving the stage;
    wherein the stage motor includes magnetic coils encased in a coolant jacket which encloses the coils and coolant,
    wherein the stage motor includes electrical leads for supplying electrical current to the coils,
    wherein coolant lines for supplying the coolant are connected to the coolant jacket, and
    wherein said electrical leads are routed inside the coolant lines to cool the leads.

8. The electron beam projection system of claim 7 wherein the stage motor comprises a multi-phase linear stage motor.

9. The electron beam projection system of claim 7 wherein contains a vacuum processing environment.

10. The electron beam projection system of claim 7, wherein said electrical leads are electrically insulated.

11. The electron beam projection system of claim 10, wherein said electrically insulated electrical leads are spirally twisted together.

12. The electron beam projection system of claim 7 wherein the coolant comprises gas coolant.

13. The electron beam projection system of claim 7 wherein the coolant comprises liquid coolant.

14. The electron beam projection system of claim 13 wherein the liquid coolant comprises a non-conductive liquid coolant.

15. The electron beam projection system of claim 7, wherein coolant lines include pairs of coolant lines, each pair of coolant lines includes a first coolant output line and a second coolant output line and wherein said electrical leads comprise pairs of electrical leads arranged such that a first electrical lead of the pair of electrical leads is routed through the first coolant output line and such that such that a second electrical lead of the pair of electrical leads is routed through the second coolant output line.

16. The electron beam projection system of claim 15, wherein each pair of coolant lines is configured in a twisted arrangement, wherein the first coolant output line and the second coolant output line are twisted about each other so that the first electrical lead and the second electrical lead are arranged in a twisted pair arrangement.

17. The electron beam projection system of claim 7, wherein coolant lines include at least one coolant input line and at least one coolant output line and wherein said electrical leads are routed through the at least one coolant output line.

18. The electron beam projection system of claim 17, wherein the coolant comprises a non-conducting coolant material and wherein the electrical leads are not electrically insulated.

19. The electron beam projection system of claim 17, wherein said electrical leads comprise at least two electrical leads and wherein the at least one coolant output line comprises at least two coolant output lines and wherein each of the at least two electrical leads is routed through one of the at least two coolant output lines.

20. The electron beam projection system of claim 17, wherein the magnetic coils of the multi-phase stage motor form part of a three phase motor,
  wherein the three phase motor includes six electrical leads for supplying electrical current to the coils,
  wherein the at least one coolant output line comprises six coolant output lines, and
  wherein each of the six electrical leads is routed through one of the six coolant output lines.

21. The electron beam projection system of claim 20, wherein the coolant comprises gas coolant.

22. The electron beam projection system of claim 20, wherein the coolant comprises liquid coolant.

23. The electron beam projection system of claim 22, wherein the liquid coolant comprises a non-conductive liquid coolant.

24. An electron beam projection system as in claim 7 further including an electrostatic chuck for securing a wafer during processing, wherein the electrostatic chuck includes electrical leads for supplying the chuck with electrical power, and wherein the electrical leads supplying power to the chuck are routed through the coolant lines.

25. A method for cooling electrical leads in a process chamber of an electron beam projection system wherein the process chamber includes at least one movable stage having at least one electric stage motor for moving the stage wherein the stage motor includes magnetic coils encased in a coolant jacket which encloses the coils and coolant and wherein coolant lines supply coolant to the coolant jacket and include coolant lines for passing coolant into the coolant jacket and at least one coolant return line enabling coolant efflux from the coolant jacket and wherein the process chamber includes electrical leads for supplying electrical current to systems contained within the process chamber, the method comprising:
  flowing coolant through the coolant lines;
  cooling the electrical leads by passing the electrical leads through the at least one coolant return line whereby the electrical leads are cooled by the coolant within the coolant return line.

26. A method for cooling electrical leads as in claim 26 wherein the electrical leads for supplying electrical current to systems contained in the process chamber includes electrical leads for supplying electrical current to the stage motor and wherein
  cooling the electrical leads for supplying electrical current to the stage motor by passing the electrical leads through the at least one coolant return line whereby the electrical leads are cooled by the coolant.

27. A method for cooling electrical leads as in claim 26 wherein cooling the electrical leads by passing the electrical leads through the coolant lines for supplying coolant further comprises passing the electrical leads through a plurality of coolant return lines.

28. An electron beam projection system comprising:
  at least one process chamber containing therein a vacuum environment, and having therein, at least one movable stage and at least one electric stage motor for moving the stage,
  wherein the electrical stage motor includes magnetic coils encased in a coolant jacket which encloses the coils and encloses an electrically non-conductive coolant material,
  wherein the coolant jacket includes coolant input lines for supplying coolant to the coolant jacket,
  wherein the coolant jacket includes coolant return lines for allowing the coolant to flow out of the coolant jacket;
  the process chamber including un-insulated electrical leads for supplying electrical current to the at least one electric stage motor contained within the process chamber; and
  wherein the electrical leads pass through the coolant lines.

29. An electron beam projection system as in claim 28, wherein the at least one movable stage includes a wafer stage for moving a semiconductor wafer during processing, and wherein the wafer stage includes an electrostatic chuck for securing the semiconductor wafer to the wafer stage, and wherein the electrical leads for supplying electrical current to systems further include electrical leads for supplying electrical power to the electrostatic chuck and wherein the electrical leads for supplying electrical power to the electrostatic chuck pass through the coolant lines.

30. An electron beam projection system having a process chamber containing therein at least one movable stage and at least one electric stage motor for moving the stage;
  wherein the stage motor includes magnetic coils encased in a coolant jacket which encloses the coils and coolant,
  wherein coolant lines for supplying the coolant are connected to the coolant jacket, said coolant lines including pairs of coolant lines, wherein each pair of coolant lines includes a first coolant output line and a second coolant output line, and
  wherein the stage motor includes pairs of electrical leads for supplying electrical current to the coils wherein said pairs of electrical leads are arranged such that a first electrical lead of the pair of electrical leads is routed through the first coolant output line and such that such that a second electrical lead of the pair of electrical leads is routed through the second coolant output line.

31. The electron beam projection system of claim 30, wherein each pair of coolant lines is configured in a twisted arrangement, wherein the first coolant output line and the second coolant output line are twisted about each other so that the first electrical lead and the second electrical lead are arranged in a twisted pair arrangement.

32. The electron beam projection system of claim 30 wherein the stage motor comprises a multi-linear stage motor.

33. The electron beam projection system of claim 30 wherein contains a vacuum processing environment.

34. The electron beam projection system of claim 30, wherein said electrical leads are electrically insulated.

35. The electron beam projection system of claim 30 wherein the coolant comprises gas coolant.

36. The electron beam projection system of claim 30 wherein the coolant comprises liquid coolant.

37. The electron beam projection system of claim 30, wherein the coolant comprises a non-conducting coolant material and wherein the electrical leads are not electrically insulated.

* * * * *

UNITED STATES PATENT AND TRADEMARK OFFICE
CERTIFICATE OF CORRECTION

PATENT NO. : 6,756,706 B2 Page 1 of 1
DATED : June 29, 2004
INVENTOR(S) : Douglas C. Watson

It is certified that error appears in the above-identified patent and that said Letters Patent is hereby corrected as shown below:

<u>Column 9,</u>
Line 46, "claim 26" should read -- claim 25 --.

<u>Column 10,</u>
Line 49, "multi-linear" should read -- multi-phase linear --.

Signed and Sealed this

Twenty-first Day of December, 2004

JON W. DUDAS
*Director of the United States Patent and Trademark Office*